US009768769B2

(12) United States Patent
Werker et al.

(10) Patent No.: US 9,768,769 B2
(45) Date of Patent: Sep. 19, 2017

(54) POWER ELECTRONIC DEVICE ASSEMBLY FOR PREVENTING PARASITIC SWITCHING-ON OF FEEDER CIRCUIT-BREAKER

(71) Applicant: Hanon Systems, Daejeon (KR)

(72) Inventors: Stephan Werker, Merzenich-Golzheim (DE); Mario Lenz, Kerpen (DE); Stephen Newton, Ann Arbor, MI (US)

(73) Assignee: HANON SYSTEMS, Daejeon (KR)

( * ) Notice: Subject to any disclaimer, the term of this patent is extended or adjusted under 35 U.S.C. 154(b) by 0 days.

(21) Appl. No.: 15/196,143

(22) Filed: Jun. 29, 2016

(65) Prior Publication Data

US 2016/0380625 A1    Dec. 29, 2016

(51) Int. Cl.
*H03K 3/00* (2006.01)
*H03K 17/16* (2006.01)

(52) U.S. Cl.
CPC ......... *H03K 17/168* (2013.01); *H03K 17/165* (2013.01)

(58) Field of Classification Search
CPC .................................................. H03K 17/161
See application file for complete search history.

(56) References Cited

U.S. PATENT DOCUMENTS

2015/0171852 A1*  6/2015  Pang ................ H03K 17/08104
                                                              327/109

* cited by examiner

*Primary Examiner* — Daniel Puentes
(74) *Attorney, Agent, or Firm* — Shumaker, Loop & Kendrick, LLP; James D. Miller

(57) ABSTRACT

Disclosed herein is a power electronic device assembly for preventing parasitic switching-on of a feeder circuit breaker. The assembly includes a logic circuit, a power switch with an input and a reference leg, and a driver circuit which drives the power switch. The driver circuit includes a drive unit and a short circuit having a safety function. When the input of the power switch is not operated, the power switch is short-circuited by the reference leg so that the potential of the input decreases below a switching-on threshold. An additional wire connection device is disposed between the driver circuit and the power switch and configured such that when no or excessively small amount of supply voltage is applied, the input of the power switch is short-circuited or is coupled to a safety potential at which discharge is secured, whereby discharge of parasitic charge current is secured.

5 Claims, 6 Drawing Sheets

POWER ELECTRONIC DEVICE ASSEMBLY FOR PREVENTING PARASITIC SWITCHING-ON OF FEEDER CIRCUIT-BREAKER

CROSS-REFERENCE TO RELATED PATENT APPLICATION

This application claims priority to German Patent Application No. 102015110423.7 filed on Jun. 29, 2015, the disclosure of which is incorporated herein by reference in its entirety.

FIELD OF THE INVENTION

Exemplary embodiments of the present invention relate to a power electronic device assembly for preventing parasitic switching-on of a feeder circuit-breaker, and a method of preventing parasitic switching-on of the feeder circuit-breaker when a driver supply voltage is excessively low or is not present while the power electronic device assembly is in use. The application field of the present invention is a field pertaining to a semiconductor and an assembly for changing the direction of current of electric power. The assembly includes a driver circuit for driving a power switch and, in particular, an inverter which is configured to drive an electric motor for a refrigerant compressor that is particularly electrically operated.

BACKGROUND OF THE INVENTION

For example, a logic circuit such as a microcontroller cannot directly supply current and voltage required for driving a power switch such as an insulated-gate electrode transistor (IGBT) having an insulated control terminal-electrode, a transistor, or a metal-oxide-semiconductor field-effect transistor (MOSFET). Due to this, in a power electronic device assembly, a single- or multi-driver circuit is disposed between the logic circuit and the power switch. Meanwhile, the driver circuit is provided to control required current and voltage. On the other hand, a structure in which a protective and safety function is integrated in the driver circuit belongs to the prior art. Recently, most driver circuits are converted based on an integrated circuit (IC).

A protective- and safety-function which is mainly used in a driver-IC is a "Miller-clamp" function of a short circuit that is configured to selectively short-circuit a control input (gate, base) and a reference leg (emitter, source) of the power switch. In this regard, when the power switch is not in operation, the input (gate, base) of the power switch is actively transmitted by the driver to a potential far below a switching-on threshold value of the power switch. Thereby, first of all, the power switch is undesirably switched on by charge of a parasitic capacitance. Here, the parasitic capacitance may be a so-called Miller-capacitance which is generated between the input (gate) and a collector of the power switch in the case where the IGBT is used as the power switch, and which is generated between the input (gate) and an output (drain) of the power switch in the case where the MOSFET is used as the power switch.

The risk of switching-on through the parasitic capacitance of the power switch is present in an assembly that particularly includes a power switch for high-current and high-voltage with a high switch frequency. A prior art aims to embody a Miller-clamp using a switch integrated in the driver-IC. Such a switch is typically embodied in the IC by an N-channel-FET (field effect transistor) or an NPN-transistor.

Connection of the switch, in other words, activation of the Miller-clamp, is embodied only when a positive (+) voltage is applied to a transistor disposed in the IC. The reason for this is because a positive supply voltage is required for connection of the N-channel-FET or the NPN-transistor. If no or an excessively small amount of supply voltage for operating the driver-IC is provided, the protective function of the Miller-clamp is also not operated. This occurs every time an inverter configured to supply power to a driver for an upper power switch, that is, a high-side-power switch driver, through a bootstrapping circuit, starts. Bootstrapping is generated by connection of a driver supply voltage for the high-side driver to a lower power switch, that is, a low-side-switch, of a half bridge. Due to this, even while the inverter is already actively operated, the protective function integrated in the driver IC may not act due to undervoltage. This condition may cause damage to a power unit.

SUMMARY OF THE INVENTION

An object of the present invention is to provide a power electronic device assembly which includes a logic circuit, a power switch and a driver unit and is configured such that even when no voltage is applied to the driver unit itself or a voltage applied thereto is insufficient to perform a protective function, undesirable switching-on of the power switch can be prevented.

The object of the present invention is solved by a power electronic device assembly for preventing parasitic switching-on of a power switch having characteristics as shown and described herein. The power electronic device assembly for preventing parasitic switching-on of a feeder circuit breaker includes a logic, a power switch including a control terminal as an input of the power switch and a reference leg, and a single- or multi-stage driver circuit disposed between the logic and the power switch and configured to drive the power switch. The driver circuit includes a drive unit and a short circuit having a safety function. In the safety function, when the input of the power switch is not in operation, the short circuit short-circuits the input using the reference leg of the power switch, whereby a potential of the input decreases below a switching-on threshold value of the power switch. According to the present invention, an additional wire connection device is disposed between the driver circuit and the power switch. The additional wire connection device is configured such that when a supply voltage for the driver circuit or, in some cases, for the short circuit, is not applied or is excessively low, the input of the power switch is short-circuited by the reference leg of the power switch or is coupled to a safety potential at which discharge is secured, whereby discharge of parasitic charge current generated on the input of the power switch is secured.

According to the concept of the present invention, due to the additional wire connection unit provided between the driver circuit and the power switch, even when no or excessively small amount of supply voltage is applied, discharge of parasitic charge current generated on the input of the power switch is secured. This can be embodied as the input (gate) of the power switch is short-circuited by the reference leg (emitter) of the power switch. However, a driver circuit of a higher power grade which provides even another negative (−) supply voltage may be present. In this case, discharge of parasitic charge current can be embodied as the input of the power switch is coupled to the negative supply voltage for safety measures.

The additional wire connection may be preferably embodied by an additional self-conductive switch, for example, a PNP-transistor or P-channel-FET that is switched off by application of a sufficient supply voltage for the driver, or may be embodied by interaction between a diode and a bootstrapping circuit.

One significant advantage of the present invention is that a drive circuit which is available at market can be used by a Miller-clamp function as it is. However, parasitic switching-on may also be prevented at a threshold driver voltage position. In this case, the circuit cost and expenses are reduced. Likewise, supplement of the existing power unit using the additional wire connection can also be simply realized at low cost.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF SPECIFIC EMBODIMENTS

Figure 1:
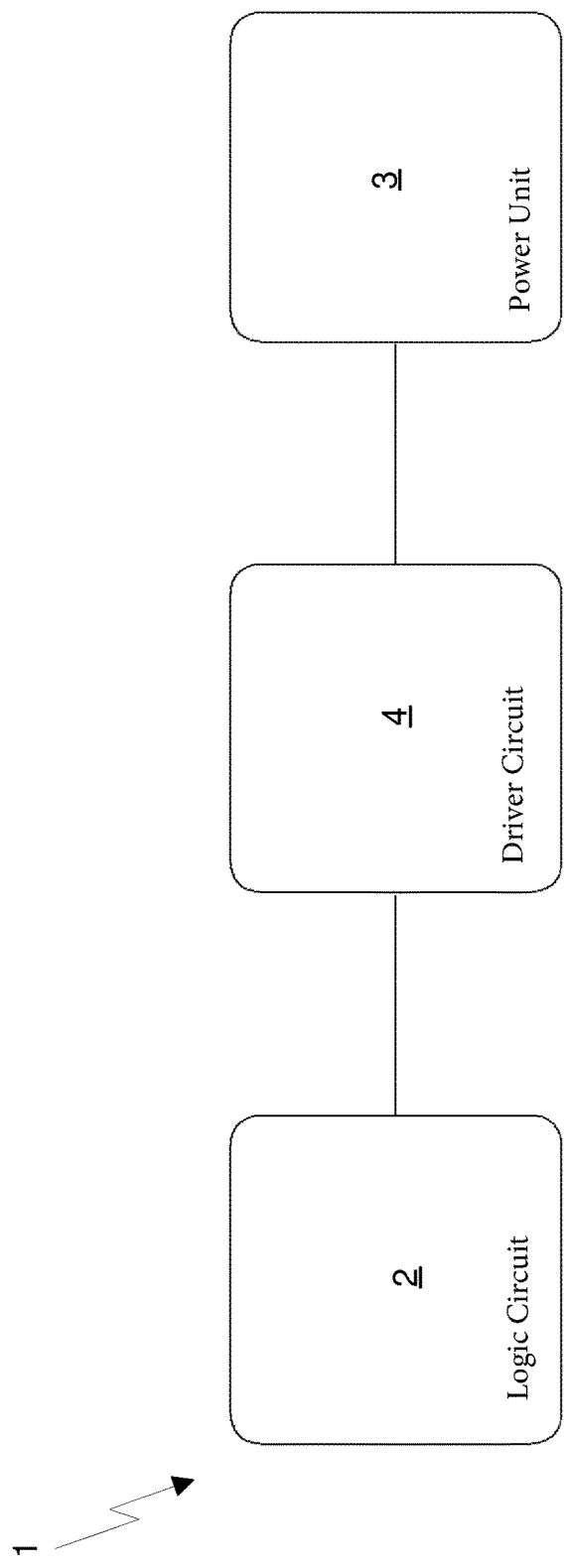
FIG. 1 is a schematic diagram of a power electronic device assembly according to a conventional art which is constructed of a logic circuit, a driver circuit and a power switch.
Figure 2:
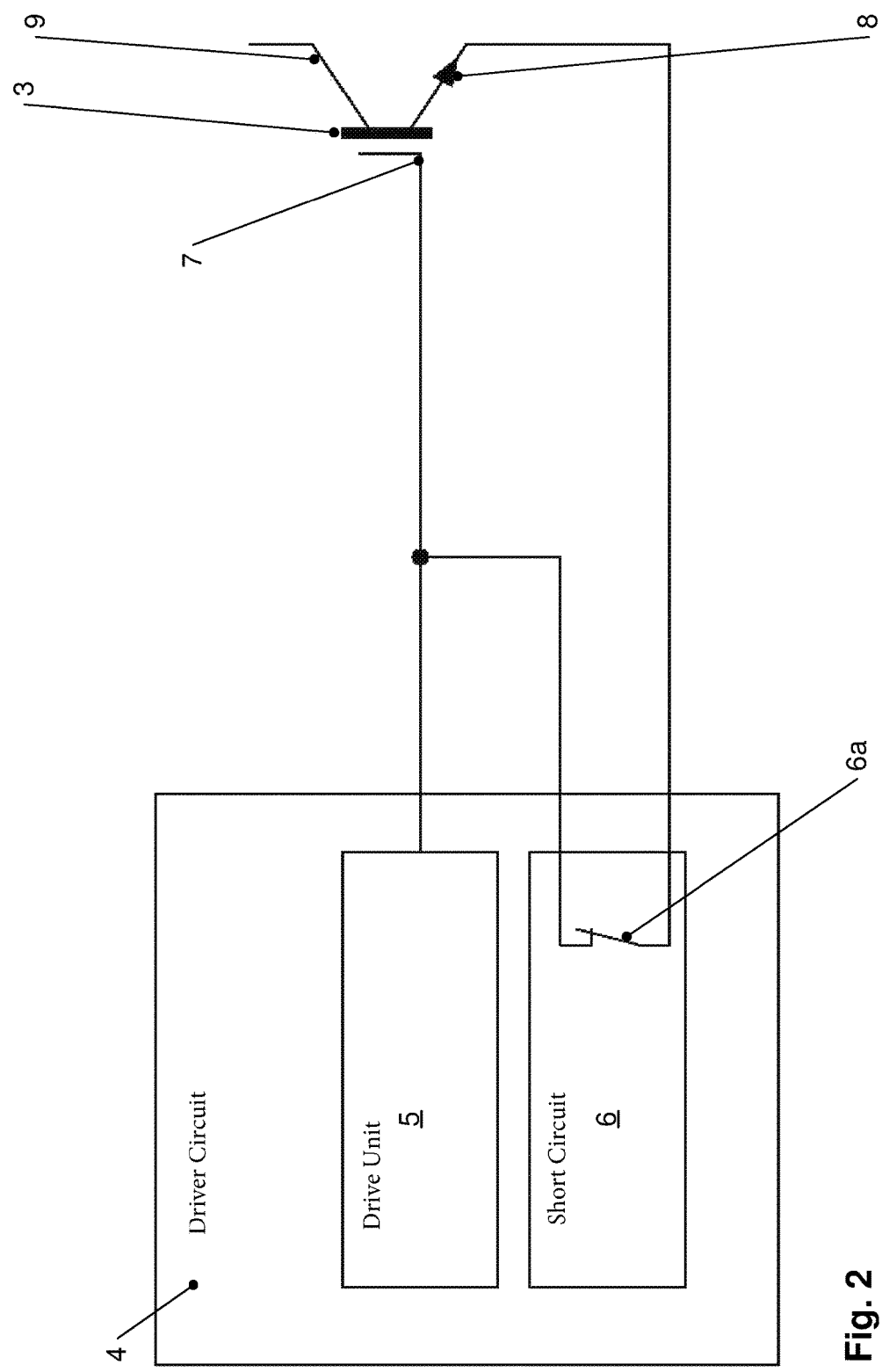
FIG. 2 is a schematic diagram showing a driving method of a power switch (IGBT) according to a conventional art which is driven by a driver unit to which a miller-clamp is connected.

FIG. 1 shows a schematic diagram of a power electronic device assembly 1 in which drive of a power unit 3 is performed through a driver unit 4 by a logic circuit 2, for example, a microcontroller 2, a field programmable gate array (FPGA) 2 or a digital signal processor (DSP) 2. The logic circuit, for example, a microcontroller, cannot directly provide current and voltage required for driving a power switch such as an insulated-gate bipolar transistor (IGBT) including an insulated control terminal-electrode or a metal-oxide-semiconductor field-effect transistor (MOSFET). Therefore, in the power electronic device assembly, a single- or multi-stage driver circuit 4 is disposed between the logic circuit 2 and the power switch 3. Such configuration is generally well known in the conventional art and is schematically illustrated in FIG. 1. FIG. 2 shows a detailed diagram of the driver circuit 4 of the power electronic device assembly 1. The driver circuit 4 is provided to control current and voltage required for switching the power switch 3 by the drive unit 5. On the other hand, a structure in which a protective and safety function is integrated in the driver circuit 4 belongs to the conventional art. Most of the driver circuit 4 is converted to an integrated state based on an integrated circuit IC. FIG. 2 schematically shows, corresponding to the conventional art, a driving method of the power unit 3 by the driver unit 4 that includes a short circuit 6, that is, a Miller-clamp 6 for a protective and safety function, which is frequently used in a so-called driver-IC. In this regard, when the power switch 3 is not in operation, an input 7 of the power switch 3 that is also called a control terminal 7 or a gate 7 is actively transmitted by the driver 4 to a potential far below a switching-on threshold value of the power switch 3. This operation is embodied, as the input 7 of the power switch 3 is short-circuited by a reference leg 8 (in the case of an IGBT, an emitter 8, or in the case of an MOSFET, a source 8) of the power switch 3. Accordingly, first of all, the power switch 3 can be prevented from being undesirably switched on by charge of a parasitic capacitance, particularly, Miller-capacitance. In the case where an insulated-gate electrode transistor (IGBT) including an insulated control terminal-electrode is used as the power switch 3, the Miller-capacitance is a parasitic capacitance generated between a collector 9 of the power switch 3 and the input 7 of the power switch 3 that is also called the gate 7. In the case where a metal-oxide-semiconductor field-effect transistor (MOSFET) is used as the power switch 3, the Miller-capacitance is a parasitic capacitance generated between the input (gate) 7 of the power switch 3 and an output (drain) 9 of the power switch 3.

Figure 3:
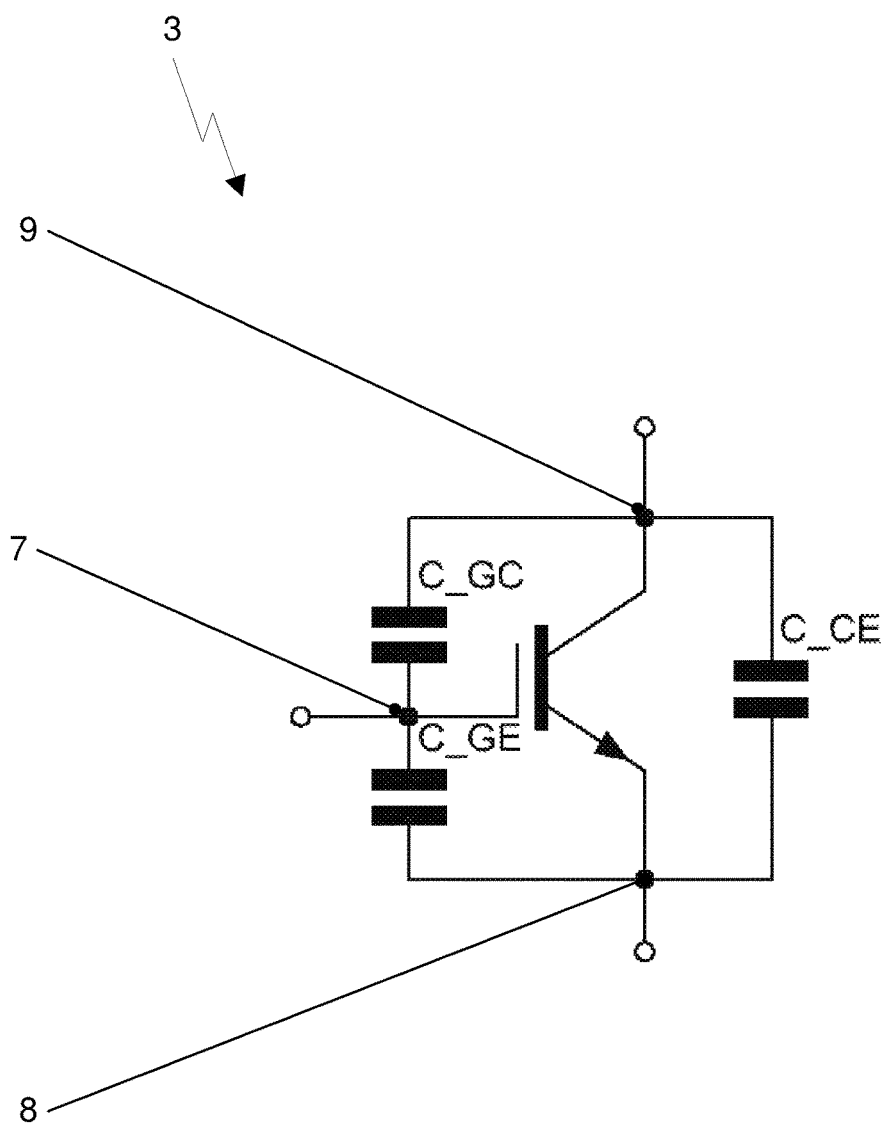
FIG. 3 is a schematic diagram showing a bipolar transistor including an insulated-gate electrode transistor (IGBT) according to a conventional art in which a parasitic capacitance is generated.

FIG. 3 illustrates a bipolar transistor type power switch 3 including an insulated-gate electrode transistor (IGBT) which has a control terminal 7 or a gate 7 as an input 7 of the power switch 3, a collector 9 and a reference leg 8, that is, an emitter 8, of the power switch 3. This drawing schematically illustrates generated parasitic capacitances C_GC, C_GE and C_CE. As mentioned above, the Miller-capacitance C_GC is a capacitance generated between the gate 7 and the collector 9 of the power switch 3. An additional parasitic capacitance is generated in the form of a capacitance C_GE between the gate 7 and the emitter 8 of the power switch 3 and in the form of a capacitance C_CE between the collector 9 and the emitter 8.

Figure 4:
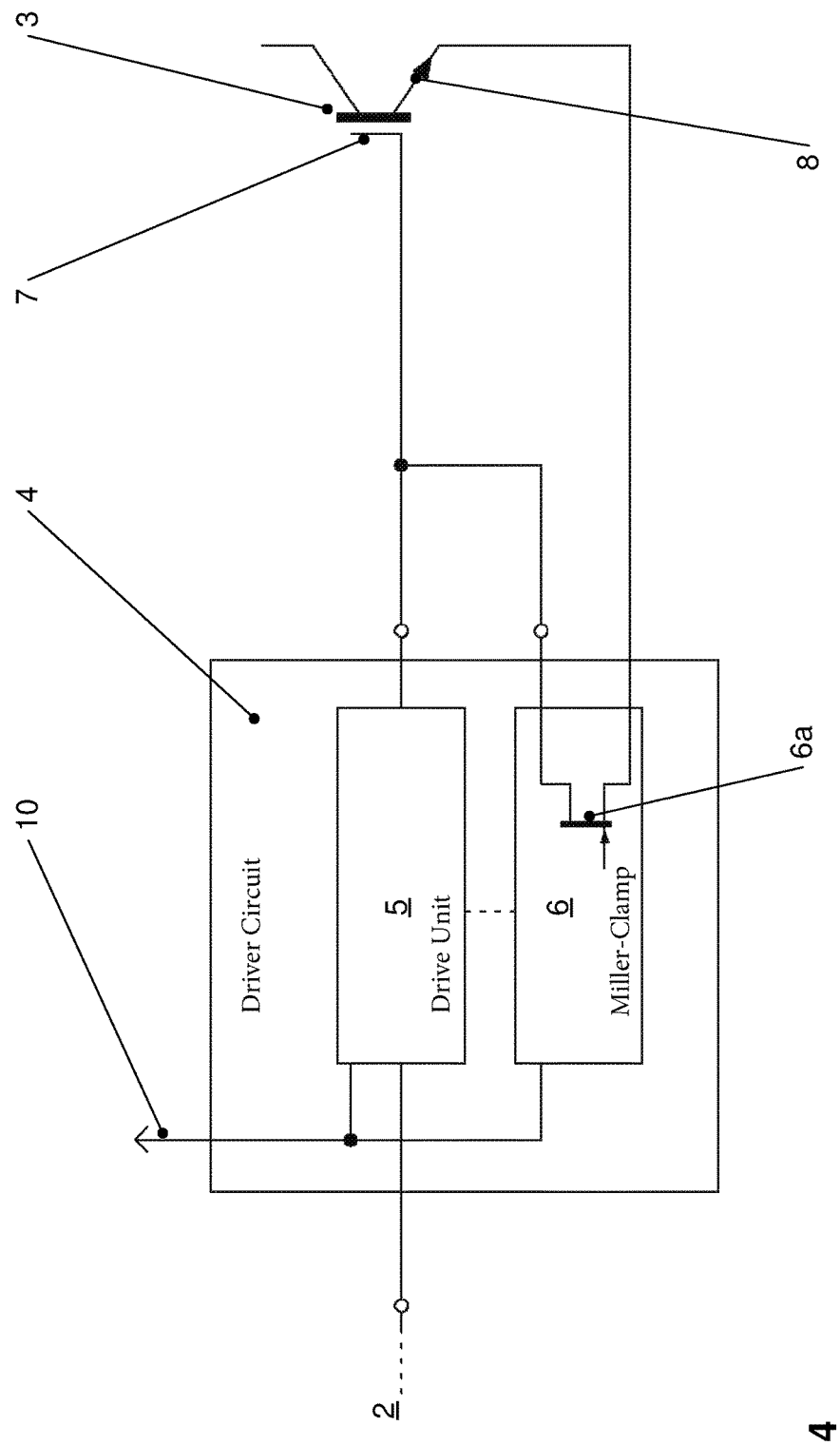
FIG. 4 is a schematic diagram showing a power electronic device assembly according to a conventional art having a Miller-clamp function based on an N-channel-electric-field effect in a driver circuit.

FIG. 4 schematically illustrates an assembly 1 according to a conventional art in which a driver circuit 4 is provided between a logic circuit 2 and a power switch 3. In this assembly, the Miller-clamp 6 is embodied by a switch 6a that is integrated in an integrated circuit (IC) of the driver circuit 4. As shown in FIG. 4, the switch 6a is typically embodied in the IC by an N-channel-field effect transistor (FET) or an NPN-transistor. Connection of the switch 6a, in other words, activation of the Miller-clamp 6, is embodied only when a positive (+) voltage 10 is applied to the switch 6a or transistor 6a that is disposed in the IC. If no or excessively small amount of driver-supply voltage 10 for operating the driver-IC is applied to the driver-IC, a protective function of the Miller-clamp 6 is not activated, and the input 7 and the reference leg 8 of the power switch 3 cannot be short-circuited.

Figure 5:
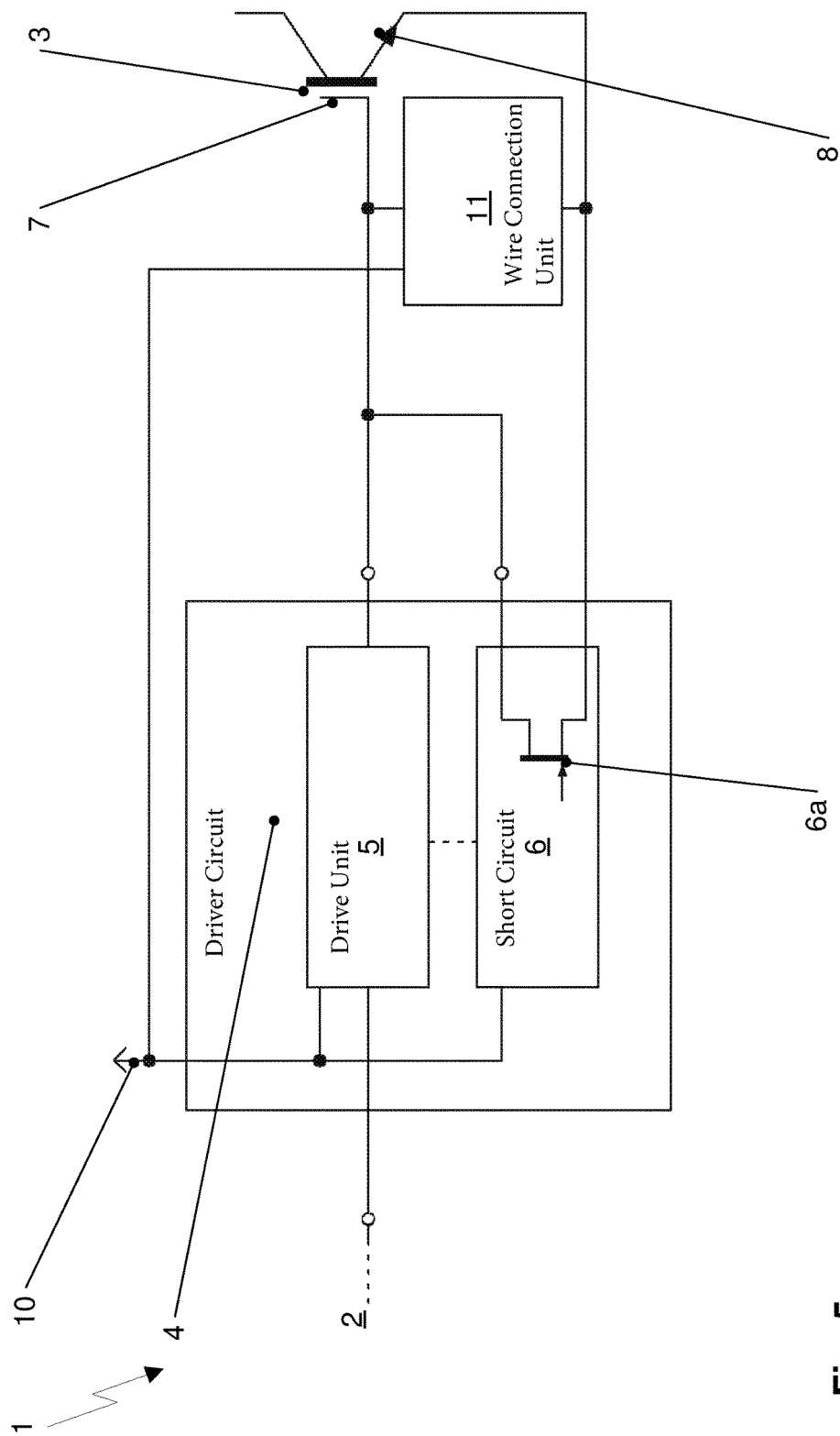
FIG. 5 is a schematic diagram illustrating a power electronic device assembly including an additional wire connection device provided between a driver circuit and a power switch.

FIG. 5 illustrates a power electronic device assembly 1 corresponding to that of FIG. 4 with a few exceptions. This assembly includes an additional wire connection unit 11 between the driver circuit 4 and the power switch 3. Due to the additional wire connection unit 11 provided between the driver circuit 4 and the power switch 3, even when no or excessively small amount of supply voltage 10 is applied to the driver circuit 4, short-circuiting of the input 7 (the gate 7) of the power switch 3 by the reference leg 8 (emitter 8) of the power switch 3 is secured.

Figure 6:
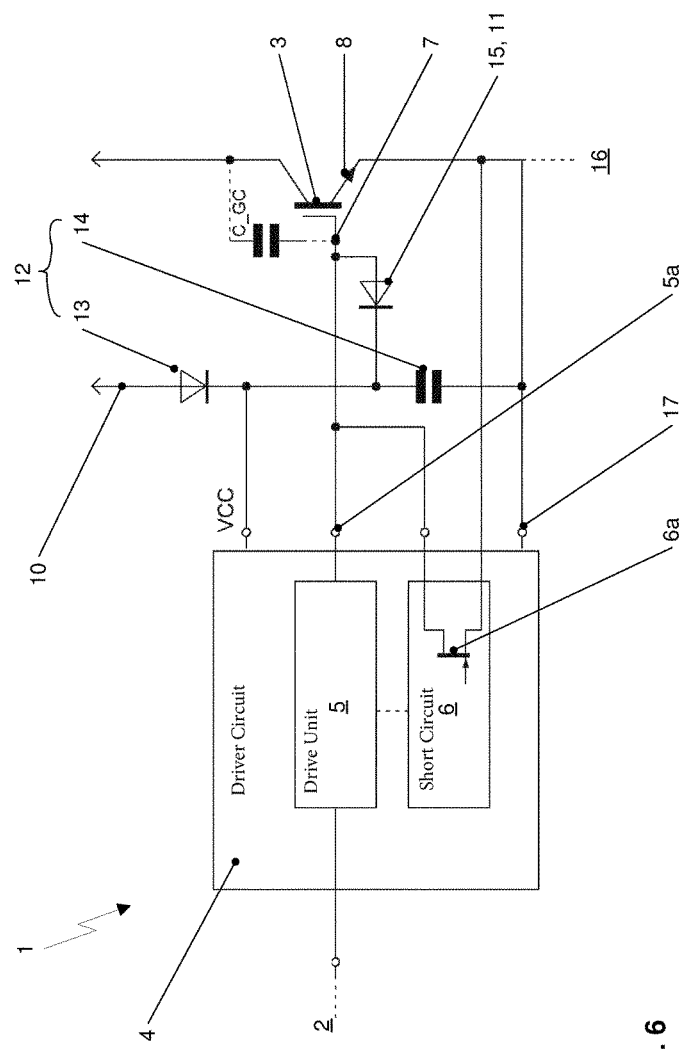
FIG. 6 is one example showing an additional wire connection state with reference to a high-side-driver circuit including an additional diode for imaging a Miller-clamp function when power is supplied through bootstrapping and supply voltage of a driver and a short circuit (Miller clamp) integrated in the driver is low.

FIG. 6 is a diagram showing an example of a power electronic device assembly 1 with a high-side-driver circuit 4 including a drive unit 5 having an output 5a for a high-side-power switch 3 to which a driver-supply voltage 10 is applied through a bootstrapping circuit 12. The term "bootstrapping circuit" refers to an electric circuit in which potential variation on a portion of the circuit is abruptly affected to other portions. In this regard, in the case of a small amount of current, an effect in which capacitors vary only small amount of their own voltages is used. These capacitors transfer potential variation at one side to other sides together. The bootstrapping circuit 12 includes a diode 13 and a capacitor 14. Including the drive unit 5 for the power switch 3, the driver circuit 4 further includes a Miller-clamp 6 which functions as a short circuit 6 that includes an integrated switch 6a and is configured such that when an input 7 of the power switch 3 is not operated, the input 7 is short-circuited using a reference leg 8 (an emitter 8) of the power switch 3. In the illustrated embodiment, an additional wire connection unit 11 provided between the driver circuit 4 and the power switch 3 includes an additional diode 15 for imaging the function of the Miller-clamp 6 when the driver supply voltage 10 is relatively low.

When the assembly 1 starts, a positive driver supply voltage VCC is 0V in the same manner as that of the case where it is applied to the capacitor 14, and the function of the Miller-clamp 6 of the driver 4 is not performed. Although not shown in FIG. 6, as a low-side-power switch forming an electric connector 16 is connected to the assembly 1, a driver reference potential 17 is varied relative to the supply voltage VCC, and the capacitor 14 is charged. For instance, parasitic switching-on through the Miller-capacitance C_GC is prevented, as charge current is discharged from the gate 7 of the power switch 3 by the additional diode 15. When the capacitor 14 is charged to a degree with which it reaches the minimum supply voltage of the driver 4, in other words, the minimum required supply voltage VCC, the function of the Miller-clamp 6 is performed by the driver 4 and, at this time, the diode 15 is operated in an interruption direction and thus inactivated. If the positive voltage VCC decreases below the minimum required supply voltage of the driver 4 during the continuous operation of the capacitor 14, the diode 15 re-performs the Miller-clamp function. The precondition for this is that the sum of the voltage on the capacitor 14 and the forward bias on the diode of the bootstrapping circuit 12 is below the minimum switching threshold value of the power switch 3. This precondition can be easily achieved in the case where the driver circuit 4 is designed using the diode 13 and the power switch 3, which are recently mainly used.

What is claimed is:

1. A power electronic device assembly for preventing parasitic switching-on of a feeder circuit breaker, comprising:
    a logic circuit;
    a power switch including a control terminal as an input of the power switch and a reference leg;
    a driver circuit disposed between the logic circuit and the power switch configured to drive the power switch, the driver circuit including a drive unit and a short circuit having a safety function, wherein when the input of the power switch is not in operation, the short circuit short-circuits the power switch using the reference leg of the power switch so a potential of the input decreases below a switching-on threshold value of the power switch; and
    a wire connection device disposed between the driver circuit and the power switch, wherein the wire connection device is configured such that when a supply voltage for the driver circuit or the short circuit is not applied thereto or is lower than a predetermined value, the input of the power switch is short-circuited by the reference leg of the power switch or is coupled to a safety potential at which discharge is secured, whereby discharge of a parasitic charge current generated on the input of the power switch is secured, wherein the wire connection device includes a bootstrapping circuit and a diode.

2. The power electronic device assembly according to claim 1, wherein the power switch further comprises an insulated-gate electrode transistor (IGBT) having an insulated control terminal-electrode, or a metal-oxide-semiconductor-field-effect transistor (MOSFET).

3. The power electronic device assembly according to claim 1, wherein the wire connection device includes a self-conductive switch, wherein the switch is configured such that when the supply voltage sufficient for the driver is applied, the switch is switched off.

4. The power electronic device assembly according to claim 3, wherein the self-conductive switch further comprises a PNP-transistor or a P-channel-FET (field-effect transistor).

5. The power electronic device assembly according to claim 1, wherein the driver circuit is a single-stage driver circuit or a multi-stage driver circuit.

* * * * *